United States Patent
Shoji et al.

(10) Patent No.: US 6,221,692 B1
(45) Date of Patent: Apr. 24, 2001

(54) METHOD OF FABRICATING SOLDER-BEARING SILICON SEMICONDUCTOR DEVICE AND CIRCUIT BOARD MOUNTED THEREWITH

(75) Inventors: Takashi Shoji, Chiba; Takekazu Sakai, Chichibu, both of (JP)

(73) Assignee: Showa Denko, K.K., Tokyo (JP)

( * ) Notice: Subject to any disclaimer, the term of this patent is extended or adjusted under 35 U.S.C. 154(b) by 0 days.

(21) Appl. No.: 09/382,673

(22) Filed: Aug. 25, 1999

Related U.S. Application Data

(62) Division of application No. 09/139,562, filed on Aug. 25, 1998, now Pat. No. 5,982,629.

(30) Foreign Application Priority Data

Aug. 25, 1997 (JP) .................................... 9-243397

(51) Int. Cl.$^7$ .......................... H01L 21/44; H01L 21/48; H01L 21/50
(52) U.S. Cl. .......................... 438/106; 438/110; 438/121; 438/612
(58) Field of Search .................................. 438/106, 108, 438/110, 121, 612

(56) References Cited

U.S. PATENT DOCUMENTS

| | | |
|---|---|---|
| 3,761,309 | 9/1973 | Schmitter et al. . |
| 4,505,029 * | 3/1985 | Owyang et al. . |
| 5,272,376 | 12/1993 | Ueno . |
| 5,461,261 | 10/1995 | Nishiguchi . |
| 5,556,023 | 9/1996 | Kuramoto et al. . |
| 5,586,715 | 12/1996 | Schwiebert et al. . |
| 5,601,459 * | 2/1997 | Seidler . |
| 5,625,230 | 4/1997 | Park et al. . |
| 5,631,499 | 5/1997 | Hosomi et al. . |
| 5,648,686 | 7/1997 | Hirano et al. . |
| 5,656,858 | 8/1997 | Kondo et al. . |
| 5,713,997 | 2/1998 | Kuramoto et al. . |
| 5,773,888 | 6/1998 | Hosomi et al. . |
| 5,872,399 | 2/1999 | Lee . |
| 5,889,326 | 3/1999 | Tanaka . |

FOREIGN PATENT DOCUMENTS

| | | |
|---|---|---|
| 0 354 114 | 7/1990 | (EP) . |
| 0 357 064 | 7/1990 | (EP) . |
| 0 595 343 A2 | 4/1994 | (EP) . |

\* cited by examiner

Primary Examiner—Kevin M. Picardat
Assistant Examiner—D. M. Collins
(74) Attorney, Agent, or Firm—Armstrong, Westerman, Hattori, McLeland & Naughton, LLP

(57) ABSTRACT

A circuit board mounted with a semiconductor device is fabricated by forming on a silicon substrate at least one first metal layer, overlaying a second metal layer to completely cover the first metal layer, covering the whole surface of the second metal layer with an insulating material, etching the insulating material to open a window at a prescribed region of the surface of the second metal layer, selectively imparting adhesiveness to the portion at the window, adhering solder powder to the adhesive portion, melting the solder powder by heating to form a solder bump, selectively imparting adhesiveness to at least one electrode portion of a wiring board, adhering solder powder to the adhesive portion, melting the adhered solder powder by heating to form a solder bump on the electrode portion, and contacting and fusing the solder bump of the silicon substrate and the solder bump of the wiring board so as to form and maintain a prescribed gap between the silicon substrate and the wiring board.

10 Claims, 2 Drawing Sheets

METHOD OF FABRICATING SOLDER-BEARING SILICON SEMICONDUCTOR DEVICE AND CIRCUIT BOARD MOUNTED THEREWITH

This application is a division of prior application Ser. No. 09/139,562, filed Aug. 25, 1998 now U.S. Pat. No. 5,982,629.

BACKGROUND OF THE INVENTION

1. Field of the Invention

This invention relates to an electrode structure for a silicon semiconductor, a silicon semiconductor device using the electrode structure that can be directly bonded to and mounted on a circuit board without use of bonding wire to enable securement of a large gap (bonding height) between itself and the circuit board at the time of mounting, a method of fabricating the semiconductor device, a circuit board having the semiconductor device mounted thereon, and a method of fabricating the circuit board.

2. Description of the Prior Art

In recent years, electronic technologies have been increasingly incorporated into virtually every type of device, machine and the like used in the factory, office and home. This in turn has led to an extensive range of electronic components being used for this purpose. The introduction of electronics into such diverse fields has particularly involved the use of very large numbers of circuit boards mounted with electronic control semiconductor devices. As a result, such circuit boards are expanding sharply in range of application, type and number.

Although many kinds of practical circuit boards have been developed and put into use, among circuit boards directly mounted with various semiconductor devices (ICs) bumps and the like, an especially large percentage are adopted for reducing electronic equipment size.

When different types of semiconductor devices etc. are mounted on a circuit board, it is necessary and preferable to leave a gap between the circuit board and the semiconductor device, usually of around 50–100 $\mu$m, for injection of sealing resin or to serve as a heat buffer.

Numerous ways have been proposed for providing this gap, which is called the "bonding height" in this specification.

These include, for example, the method of establishing the bond between the circuit portion on the printed-circuit board and the device electrodes by use of a conductive bonding agent, the method of bonding the circuit portion on the printed-circuit board and the chips by fusing solder bumps formed by plating on the chip side, the method of the plating the electrodes of the printed-circuit board and the device electrodes with copper to the required height, further plating them with gold, and bonding them with eutectic solder, the bonding method by gold ball bumps (stud bumps), the bonding method by conductive polymer bumps, the gold-plated resin ball bonding method, the method of bonding by anisotropic conductive film made of microcapsules having insulating resin balls as cores, and the method of bonding by anisotropic conductive film of the metal-ball-core microcapsule type.

Other methods are also available, such as the gold ball bump direct bonding method, but are still too high in cost to be practically applicable.

These conventional methods for establishing bonding height involve a number of shortcomings. When a conductive resin or other such conductive material with relatively high electrical resistance is adopted, the resistance of the bonds is large. On the other hand, when bonding by use of a solder-plated board is adopted, the general practice is to subject the semiconductor device side electrodes to activation processing beforehand. However, this processing is complex and leads to problems of poor spread-out of solder wetting and uneven bonding height. It also results in low reliability of the device connections.

A need has therefore been felt for a way of forming solder bumps on a silicon semiconductor device that enables the silicon semiconductor device to be bonded to a wiring board with high reliability, small bonding resistance, and freely selectable bonding height.

An object of this invention is therefore to provide an electrode structure for a silicon semiconductor device formed with solder bumps of a prescribed height.

Another object of the invention is to provide a solder-bearing silicon semiconductor device that can be directly bonded to a wiring board without use of bonding wire and is highly reliable and small in bonding resistance, and to provide a method of fabricating the silicon semiconductor device.

Another object of the invention is to provide a solder-bearlng silicon semiconductor device enabling free selection of the height of solder bumps and to provide a method of fabricating the silicon semiconductor device.

Another object of the invention is to provide a circuit board readily formable with solder bumps at the bond portions (electrode portions) and enabling mounting of a semiconductor device at a freely selectable bonding height between itself and the semiconductor device and to provide a method of fabricating the circuit board.

SUMMARY OF THE INVENTION

To achieve these objects, the invention provides an electrode structure for a silicon semiconductor device comprising a first metal layer provided on a semiconductor surface of the semiconductor device to make ohmic contact with the semiconductor and a second metal layer overlaid on the first metal layer to completely cover all surfaces including side surfaces thereof, the metal of the second metal layer having higher resistance to corrosion by organic acid and better solder wettability than the metal of the first metal layer.

As the first metal layer there can be used a layer of one member selected from among Cu, Al, Ti, W and Al-base alloys Al—Si, Al—Ti and Al—W containing not less than 95% of Al. As the second metal layer there can be used a layer of one member selected from among Cu, Ni and Au but excluding Cu when the first metal layer is of Cu.

The aforesaid electrode structure encompasses the case where an intermediate metal layer of Ni or Cr is further provided between the first metal layer and the second metal layer (the intermediate layer being limited to Cr when the second metal layer is of Ni), the intermediate metal layer completely covers the first metal layer, and the second metal layer completely covers the intermediate metal layer.

The aforesaid electrode structure further encompasses the case where all but a prescribed region of the surface of the second metal layer is shielded by an insulating material.

The invention also provides a solder-bearing silicon semiconductor device comprising a silicon substrate, at least one first metal layer provided on the substrate to make ohmic contact with silicon semiconductor of the substrate and a second metal layer overlaid on the first metal layer to completely cover all surfaces including side surfaces thereof, the metal of the second metal layer having higher resistance to corrosion by organic acid and better solder wettability than the metal of the first metal layer, insulating material shielding all but a prescribed region of the surface of the second metal layer, and a solder bump seated on the prescribed region of the surface of the second metal layer.

The invention further provides a method of fabricating a solder-bearing silicon semiconductor device comprising the steps of overlaying at least one first metal layer on a silicon substrate, overlaying a second metal layer to completely cover the first metal layer, covering the whole surface of the second metal layer with an insulating material, etching the insulating material to open a window at a prescribed region of the surface of the second metal layer, selectively imparting adhesiveness to the portion of the second metal layer surface at the window, adhering solder powder to the formed adhesive portion, and melting the solder powder by heating to form a solder bump.

The invention further provides a circuit board comprising a wiring board and a silicon semiconductor device, the silicon semiconductor device and the wiring board being adhered together by forming a solder bump at at least one electrode of the silicon semiconductor device by imparting adhesiveness to the surface of the electrode, adhering solder powder to the adhesive surface and melting the solder powder by heating, forming a solder bump at at least one electrode portion of the wiring board by imparting adhesiveness to the electrode portion, adhering solder powder to the adhesive portion and melting the solder powder by heating, and adhering the solder bump of the silicon semiconductor device and the solder bump of the wiring board.

The invention further provides a method of fabricating a circuit board comprising the steps of selectively imparting adhesiveness to at least one electrode portion of a wiring board, adhering solder powder to the portion of the wiring board imparted with adhesiveness, melting the adhered solder powder by heating to form a solder bump at the electrode portion, contacting and fusing the solder bump at the electrode of the aforesaid solder-bearing silicon semiconductor device to the solder bump of the wiring board so as to form a prescribed gap portion and, optionally, charging insulating resin for sealing into the gap formed.

In the electrode structure for a silicon semiconductor device according to the invention, the side in contact with the semiconductor is constituted of the first metal layer that makes ohmic contact with the semiconductor and the side provided with the solder bump, which is constituted of a metal layer having high resistance to corrosion by organic acid and good solder wettability, completely covers all surfaces of the first metal layer including the side surfaces thereof. Owing to this configuration, the contact between the semiconductor and the electrode is excellent, the solder layer can be readily overlaid and the reliability is high. Since the surface of the solder-bearing silicon semiconductor device to be applied with solder powder is first imparted with adhesiveness, the height of the solder bump can be easily controlled by varying the particle size of the adhered solder powder. The bonding height can therefore be freely selected. Since the silicon semiconductor device according to the invention is directly mountable on the wiring board via the solder bump (usually multiple solder bumps), the bonding resistance is low and the reliability high.

In this invention, the bonding portion of the circuit board is similarly imparted with adhesiveness and adhered with solder powder. Since the height of the solder bump can therefore be easily controlled, a large bonding height can be secured to further facilitate the bonding height adjustment.

The above and other features of the present invention will become apparent from the following description made with reference to the drawings.

DESCRIPTION OF THE PREFERRED EMBODIMENTS

The electrode structure of the invention for use in a silicon semiconductor device will be explained first.

Figure 1:
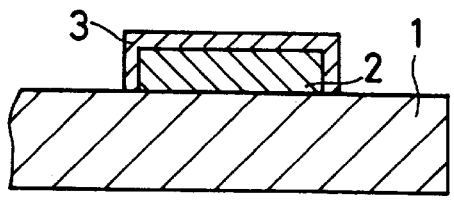
FIG. 1 is a sectional view showing an electrode structure for use in a silicon semiconductor device, which is an embodiment of the invention.

As shown in FIG. 1, the electrode structure is provided on the silicon substrate surface of a silicon semiconductor device 1 by using vacuum evaporation, sputtering or the like to form a first metal layer 2 to a prescribed thickness and then forming a second metal layer 3 to a prescribed thickness so as to cover the first metal layer 2 completely (including its side surfaces). Although not shown in the drawings, functional layer portions are present in the silicon semiconductor and electrodes are provided at a prescribed pitch to be positioned at the respective functional layer portions.

The metal used for the first metal layer 2 of the electrode structure is selected from among metals that make ohmic contact with the silicon substrate 1. Metals that make ohmic contact with silicon include Al, Cu, Ti, W and Al-base alloys. The Al-base alloys Include Al—Si, Al—Ti and Al—W alloys containing not more than 5%, preferably 1–3%, of Si, Ti and W. After the first metal layer 2 has been formed of one of these metals on the silicon semiconductor device, heat treatment is effected to establish ohmic contact. Al-base alloys have coefficients of thermal expansion near that of silicon. Use of such an alloy is therefore advantageous from the point of alleviating strain at the metal-silicon interface.

The metal of the second metal layer 3 to be formed on the first metal layer 2 is required to have higher resistance to corrosion by organic acid and better solder wettability than the metal of the first metal layer 2 and to exhibit good contact property with both the silicon semiconductor and the first metal layer. Specific examples include Cu, Ni and Au. When the first metal layer is made of Cu, a different metal (metal other than Cu) is selected for the second metal layer. The selection of the metal of the second metal layer is preferably made taking into account compatibility with the solder used to mount the silicon semiconductor device 1 on a wiring board and the contact property between the silicon semiconductor and the first metal layer.

The second metal layer 3 is formed by vacuum evaporation, sputtering, plating or the like to completely cover the first metal layer 2 and constitute an electrode.

Figure 2:
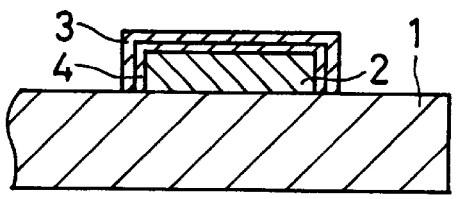
FIG. 2 is a sectional view showing an electrode structure for use in a silicon semiconductor device, which is another embodiment of the invention.

Although, as just explained, the electrode formed on the semiconductor 1 is composed of the first metal layer 2 and the second metal layer 3 preferably, as shown in FIG. 2, it further includes between the first and second metal layers an intermediate metal layer 4 of Ni or Cr (limited to Cr if the second metal layer is made of Ni). The intermediate metal layer 4 is overlaid to completely cover the first metal layer 2 and the second metal layer 3 is overlaid to completely cover the intermediate metal layer 4. The intermediate metal layer 4 enhances the strength of the second metal layer 3 serving as the surface electrode.

Figure 3:
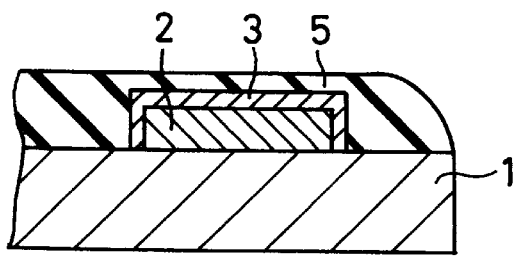
FIG. 3 is a sectional view showing the electrode of the semiconductor device of FIG. 1 shielded by insulating material.
Figure 4:
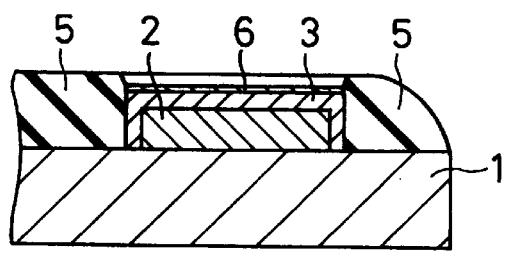
FIG. 4 is a sectional view showing a window opened in the insulating material shielding the electrode in FIG. 3 and adhesiveness imparted to the exposed portion.
Figure 5:
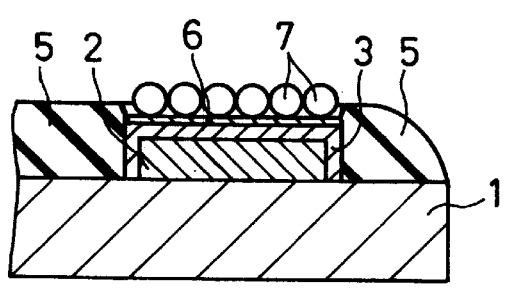
FIG. 5 is a sectional view showing solder powder supplied to the window portion in FIG. 4.
Figure 6:
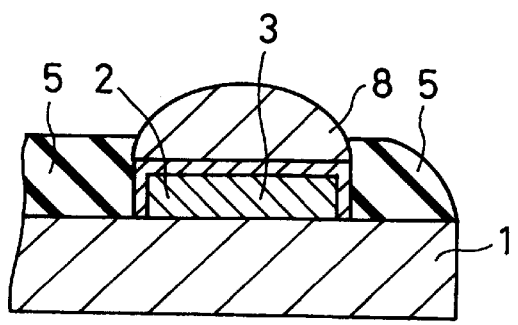
FIG. 6 is a sectional view showing a solder bump formed by heating and melting the solder powder at the window portion.

There will next be explained a solder-bearing silicon semiconductor device obtained by forming a solder layer of a thickness of 50–100 μm or greater (a "solder bump") on a silicon semiconductor device provided with the electrode of the foregoing structure. After an electrode has been formed on a surface of the silicon semiconductor 1 as shown in FIGS. 1 and 2, the surface of the semiconductor is covered with an insulating material 5 such as $SiO_2$, $Si_3N_4$, glass, polyimide or the like by use of a conventional method such as vacuum evaporation, CVD or the like. The result is shown in FIG. 3. The portion of the insulating material over the electrode is then removed by an ordinary method or by use of a mask to open a window as shown in FIG. 4. Only the exposed portion of the second metal layer at this window is selectively imparted with an adhesive substance 6. Solder powder is then sprinkled to the window portion to adhere a layer of solder powder 7 to the formed adhesive portion 6 as shown in FIG. 5. Next, the solder powder 7 is melted by heating to form a solder bump 8 In the window as shown in FIG. 6.

A particular feature of this invention is that the solder bump is formed to a considerable thickness of 50–100 μm or even greater. To form such a solder bump, the semiconductor device having the first metal layer 2 covered by the second metal layer 3 is covered by resist (the insulating material) in the foregoing manner, the metal electrode (the second metal layer) is exposed by etching in the foregoing manner, the exposed metal portion is selectively imparted with adhesiveness, solder powder is adhered to the adhesive portion, and the solder bump is formed by melting the solder powder. In this case it suffices for the resist forming the window to have a thickness of around 10 μm.

The height of the solder bump can be adjusted by appropriately selecting the particle size of the solder powder supplied to the window.

Impartation of adhesiveness to the exposed metal portion is effected by soaking in or coating with an aqueous solution containing at least one member among napthotriazole derivative, benzotriazole derivative, imidazole derivative, benzoimidazole derivative, mercaptobenzothiazole derivative, and benzothiazole thiofatty acid derivative. (See U.S. Pat. Nos. 5,556,023 and 5,713,997.)

This treatment is effected under conditions of, for example, a temperature of 30–60° C. and a soaking period of 5 sec–5 min. The aqueous solution is prepared to contain at least one of napthotriazole derivative, benzotriazole derivative, imidazole derivative, benzoimidazole derivative, mercaptobenzothiazole derivative, and benzothiazole thiofatty acid derivative at a concentration of 0.05–20 wt %. In particular, it is preferable to use as the solution for imparting solder adhesiveness one that is a slightly acidic liquid containing 50–1000 μm of copper ion.

Although this solution for imparting adhesiveness is relatively stable, it exhibits strong corrosivity to the Al etc. forming the first metal layer and is highly likely to side-etch an electrode of such a metal. In addition, for reasons not yet determined, it results in a high defective product ratio even when side etching does not occur owing to incomplete coverage. The first metal layer must therefore be completely covered by the second metal layer as explained in the foregoing.

The foregoing method of shielding one surface of the semiconductor device throughout with insulating material, forming a window (usually multiple windows) in the insulating material, selectively imparting adhesiveness to the portion at the window and adhering solder powder to this portion provides as advantageous features that no troublesome positioning steps or the like are required and that the adhesion of the solder powder can be easily automated. Moreover, unlike the conventional plating method and the like, which encounter difficulty in forming a solder layer of great thickness, the method of the invention enables a thick solder layer to be formed with ease because, even if the required thickness cannot be secured by a single cycle of the processing steps, the object can be achieved by once heating the semiconductor device adhered with the solder layer to melt part of the crown of the solder layer and then repeating the steps of the cycle to impart adhesiveness to the solder-coated portion, selectively adhere solder powder to the portion imparted with adhesiveness, and melt the adhered solder powder by heating. In addition to providing a thick layer by a single processing cycle, this method enables a still thicker solder layer to be obtained simply by adhering another solder layer to an earlier formed solder layer.

Figure 7:
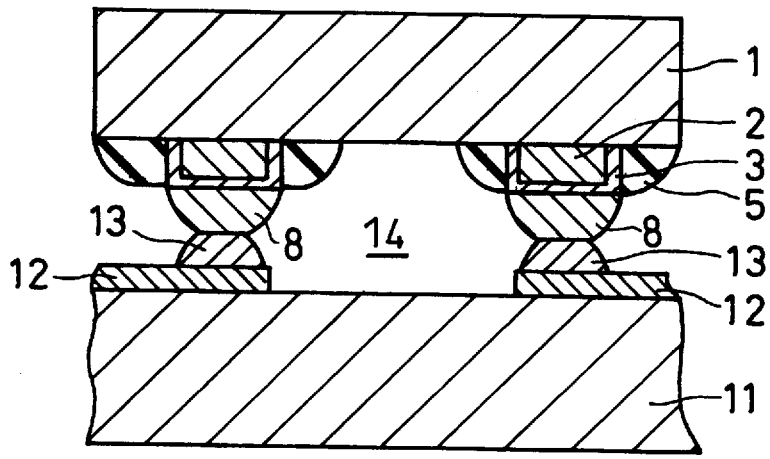
FIG. 7 is a sectional view showing a device formed with solder bumps mountable on a wiring board.

The method of forming a solder bump on a semiconductor device explained in the foregoing can also be applied, as shown in FIG. 7, to form a solder bump 13 (usually multiple solder bumps 11 as in the illustrated case) on a wiring board 11. Specifically, the wiring board 11 is coated with resist, only the bonding portions 12 (electrode portions) of the wiring board 11 are exposed, adhesiveness is imparted to the exposed portions, solder powder is supplied to the adhesive portions and the solder powder is melted by heating to form the solder bumps 13. The solder bumps 8 and 13 of the semiconductor device 1 and the wiring board 11 are then brought into contact so as to partially fuse, whereby the semiconductor device can be mounted at a large bonding height (gap) 14. The gap 14 between the device and the wiring board of the circuit board obtained by mounting the semiconductor device in the foregoing manner can, if found necessary or desirable, be charged with insulating resin for sealing.

When a circuit board having a bonding height of 50–100 μm is to be fabricated, the bump height on the semiconductor device side (electrode height+solder bump height) is made 50–120 μm and the bump height on the wiring board side (electrode height+bump height) is made 30–100 μm so that the desired bonding height can be obtained without fail even after the bumps are bonded by melting a portion of their solder.

The compositions of the solder powders for the semiconductor device and wiring board sides can be made slightly different to give them different melting points. In this case, alloying of the higher melting point solder bump with the lower melting point solder bump starts before the higher melting point solder bump melts. This is advantageous because it helps to preserve the shape of the bumps and, by this, to maintain the desired bonding height.

This effect can be obtained, for example, by on the semiconductor device side using 80 Pb/20 Sn, 95 Pb/5 Sn or other solder with a higher melting point than Sn—Pb eutectic solder and on the wiring board side using Sn—Pb eutectic solder.

The solder-bearing silicon semiconductor device according to the invention can thus be mounted without use of bonding wires. A semiconductor device bonded by bonding wire requires resin to be molded on stems or the like for protecting the bonding wire, which becomes considerably larger than the semiconductor device chip itself and takes up a large area on the circuit board. Since the semiconductor device of the invention does not require use of bonding wire, It makes a highly effective and advantageous contribution to size reduction.

The fact that a metal with good solder wettability is selected for the second metal layer makes mounting easy and ensures reliable bonding. In particular, the bonding by solder to solder provides highly conductive, strong bonding that enables direct mounting of the semiconductor device on the wiring board and greatly enhances bonding reliability.

Owing to the relative freedom in selecting the bonding height, the circuit board of the invention can be fabricated to have high tolerance and high height. Because of this, the invention circuit board can avoid the heat problems encountered in the past even when fabricated using identical materials and the same kind of semiconductor device. This also facilitates circuit board design.

Examples of the invention will now be explained. The invention is, however, not limited to the specific embodiments described.

EXAMPLE 1

Figure 8:
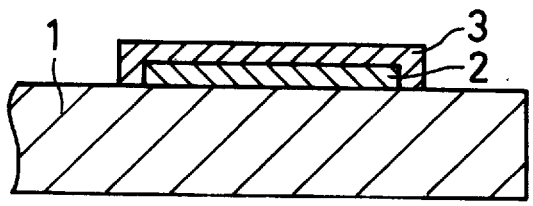
FIG. 8 is a sectional view showing a first embodiment of an electrode structure formed on a semiconductor chip.

Sixteen first metal layers 2 each composed of Al measuring 90 μm in diameter and 1 μm in thickness were formed on a 5-mm square silicon chip 1 at a pitch of 250 μm by vacuum evaporation. Second metal layers 3 consisting of Cu were formed by vacuum evaporation to a thickness of 1 μm on the Al first metal layers 2 so as to cover all surfaces thereof including the side surfaces. By this there were obtained 16 electrodes of the structure shown in FIG. 8 (electrode structure I).

Separately, 16 first metal layers 2 were formed on a silicon chip 1 by vacuum evaporation in the same manner as just described except that Cu was used instead of Al. Second metal layers 3 consisting of Ni were formed by vacuum evaporation to a thickness of 3 μm on the Cu first metal layers 2 so as to cover all surfaces thereof including the side surfaces. By this there were obtained 16 electrodes of the structure shown in FIG. 8 (electrode structure II).

Further, 16 first metal layers 2 were formed on a silicon chip 1 by vacuum evaporation in the same manner except that Al-2% Si alloy was used instead of Al. Second metal layers 3 consisting of Cu were formed by vacuum evaporation to a thickness of 1 μm on the Al—Si alloy first metal layers 2 so as to cover all surfaces thereof including the side surfaces. By this there were obtained 16 electrodes of the structure shown in FIG. 8 (electrode structure III).

Figure 9:
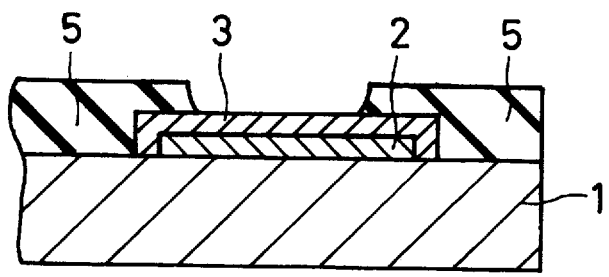
FIG. 9 is a sectional view showing a second embodiment of an electrode structure formed on a semiconductor chip.

Further, 16 first metal layers 2 each composed of Al measuring 90 μm in diameter and 1 μm in thickness were formed on a 5-mm square silicon chip 1 at a pitch of 250 μm by vacuum evaporation. Second metal layers 3 consisting of Cu were formed by vacuum evaporation to a thickness of 1 μm on the Al first metal layers 2 so as to cover all surfaces thereof including the side surfaces. A $SiO_2$ layer 5 was then formed to a thickness of 10 μm throughout as a shield, whereafter it was etched at prescribed locations to form windows and expose the Cu electrode surfaces. By this there were obtained 16 electrodes of the structure shown in FIG. 9 (electrode structure IV).

Figure 10:
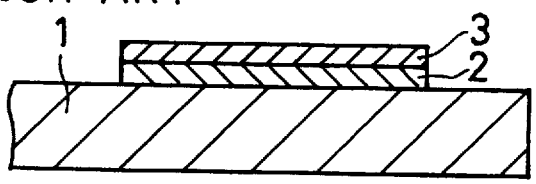
FIG. 10 is a sectional view showing a conventional electrode structure formed on a semiconductor chip.

As a comparative example, 16 first metal layers 2 each composed of Al measuring 90 μm in diameter and 1 μm in thickness were formed on a 5-mm square silicon chip 1 at a pitch of 250 μm by vacuum evaporation. Second metal layers 3 consisting of Cu were formed by vacuum evaporation to a thickness of 1 μm on the Al first metal layers 2 so as to cover only their upper surfaces. By this there were obtained 16 electrodes of the structure shown in FIG. 10 (electrode structure V).

This comparative example was repeated except that the 16 first metal layers 2 were formed by vacuum evaporation using Cu instead of Al and the second metal layers 3 were formed of Ni to a thickness of 3 μm by vacuum evaporation so as to cover only the top surfaces of the Cu first metal layers 2. By this there were obtained 16 electrodes of the structure shown in FIG. 10 (electrode structure VI).

The aforesaid six silicon chips provided with electrodes were pretreated with aqueous solution of sulfuric acid and were then soaked for 5 min in a 40° C. adhesiveness imparting solution composed of a 2 wt % aqueous solution of 2-undecylimidazole (formula (1) shown below) adjusted to pH of approximately 4.5 with acetic acid.

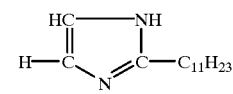

(1)

The six silicon chips were removed from the solution, washed with water and dried. Next, 20 Sn/80 Pb solder powder of an average particle size of 120 μm was sprinkled over the whole surface of the silicon chips formed with the electrodes. Excess powder at regions other than the electrodes was blown off with air. The condition of powder adhesion at this time is summarized in Table 1.

TABLE 1

| Sample | Adhesion | Remark |
| --- | --- | --- |
| Electrode structure (1) | Good | Adhesion good throughout |
| Electrode structure (2) | Good | Adhesion good throughout |
| Electrode structure (3) | Good | Adhesion good throughout |
| Electrode structure (4) | Good | Adhesion good throughout |
| Comparative examples | | |
| Electrode structure (5) | Poor | Adhesion impaired by generation of extraneous matter |
| Electrode structure (6) | Fair | Adherence at only a portion of electrode |

The six silicon chips adhered with solder powder were heated for 30 sec in a stream of 170° C. nitrogen gas to fix the solder powder, coated with water-soluble flux, preheated. to 150° C. in a reflow furnace passing nitrogen gas containing 500 ppm of oxygen and heated to a reflow temperature of 300° C. to melt the solder powder. They were then cleaned with hot water. The state of solder bump formation was examined and the bump height and bump height standard deviation ($\sigma$) were measured. The results are shown in Table 2. As is clear from this table, the heights of solder bumps are uniform. Therefore, the chips having the electrode structures I to IV will be able to be all stably mounted on a wiring board.

TABLE 2

| Sample | Shape of solder bumps | Remark | Solder bump height ($\mu$m) | Standard deviation ($\sigma$) |
|---|---|---|---|---|
| Electrode structure (I) | Good | Good coating | 103 | 3.0 |
| Electrode structure (II) | Good | Good coating | 105 | 3.1 |
| Electrode structure (III) | Good | Good coating | 105 | 3.1 |
| Electrode structure (IV) | Good | Good coating | 102 | 3.0 |
| Comparative examples | | | | |
| Electrode structure (V) | Poor | No coating | — | — |
| Electrode structure (VI) | Fair | Some coating missing | — | — |

EXAMPLE 2

Sixteen first metal layers 2 each composed of Al measuring 90 $\mu$m in diameter and 1 $\mu$m in thickness were formed on a 5-mm square silicon device substrate 1 at a pitch of 250 $\mu$m by vacuum evaporation. Second metal layers 3 consisting of Cu were formed by vacuum evaporation to a thickness of 1 $\mu$m on the Al first metal layers 2 so as to cover all surfaces thereof including the side surfaces. By this there were obtained 16 electrodes of the structure shown in FIG. 8. This silicon device substrate 1 provided with electrodes was pretreated with aqueous solution of sulfuric acid and then soaked for 5 min in a 40° C. adhesiveness imparting solution composed of a 2 wt % aqueous solution of 2-undecylimidazole adjusted to pH of approximately 4.5 with acetic acid.

The substrate was removed from the solution, washed with water, dried and sprinkled with 20 Sn/80 Pb solder powder. Excess powder was blown off with air.

The silicon device substrate adhered with solder powder in this manner was heated for 30 sec in a stream of 170° C. nitrogen gas to fix the solder powder, coated on the solder with water-soluble flux, preheated to 150° C. in a reflow furnace passing nitrogen gas containing 500 ppm of oxygen and heated to a reflow temperature of 300° C. to melt the solder powder. It was then cleaned with hot water to obtain a solder-bearing silicon semiconductor device having approximately 60 $\mu$m high solder bumps.

The foregoing process was repeated except for sprinkling solder powders of different grain sizes to obtain solder-bearing silicon semiconductor devices having solder bumps with heights measuring 80 $\mu$m, 100 $\mu$m and 120 $\mu$m instead of 60 $\mu$m.

Next, the copper circuits of a printed wiring board having 16 copper plated circuits of 90 $\mu$m width and 250 $\mu$m pitch were exposed over 90 $\mu$m×90 $\mu$m at prescribed locations and the remaining portions were coated with resist resin. As in the case of the silicon device, the board was acid-cleaned with aqueous solution of sulfuric acid and then soaked in an adhesiveness imparting solution adjusted to pH of approximately 4.5 with acetic acid to impart adhesiveness to the exposed copper circuit portions.

The printed wiring board was then sprinkled with Sn/37 Pb eutectic solder powder and excess powder was blown off with air. It was next heat treated to form an approximately 30 $\mu$m high solder bump at each copper circuit.

The foregoing process was repeated except for sprinkling solder powders of different particle sizes to obtain wiring boards having solder bumps with heights measuring 60 $\mu$m, 80 $\mu$m and 100 $\mu$m instead of 30 $\mu$m.

The solder-bearing silicon devices and the wiring boards provided with solder bumps in the foregoing manner were coated on their solder bumps with flux, placed with their solder bumps in contact, preheated to 150° C. in a reflow furnace passing nitrogen gas containing 500 ppm of oxygen and heated to a reflow temperature of 200° C. to melt and bond the tip portions of the solder, thereby obtaining circuit boards having silicon semiconductor devices mounted thereon (see FIG. 7).

The bonding heights obtained with devices and circuit boards having solder bumps of different heights are shown in Table 3.

As is clear from this table, circuit boards having bonding heights in the range of 40–87 $\mu$m can be easily obtained by selecting the combination of device and wiring board used.

TABLE 3

| Bump height (Silicon device) ($\mu$m) | Bump height (Wiring board) ($\mu$m) | Bonding height ($\mu$m) |
|---|---|---|
| 60 | 30 | 40 |
| 80 | 30 | 56 |
| 100 | 30 | 69 |
| 120 | 30 | 87 |
| 60 | 60 | 55 |
| 60 | 80 | 64 |
| 60 | 100 | 77 |

As is clear from the foregoing, the silicon semiconductor device according to the invention is excellent in solder contact property owing to its good resistance to solder corrosion and good solder wettability. When the intermediate metal layer is introduced between the first metal layer and the second metal layer, moreover, the strength of the surface electrode is enhanced. In addition, since the intermediate metal layer and the second metal layer each completely covers the layer thereunder, the metal of the lower layer is safe from being eaten away by solder or being side etched by the chemical for imparting adhesiveness.

Another merit is that the solder bump height can be easily controlled by selecting the particle size of the solder powder adhered in the solder powder adhering step. When this solder-bearing silicon semiconductor device is mounted on a wiring board, the mounting is effected after the wiring board has also been formed with similar solder bumps. Since this enables securement of a large bonding height, it provides higher heat resistance property and greater ease of circuit board design for a given combination of material and semiconductor device.

Since the invention thus enables semiconductor device mounting without use of bonding wire, it achieves low bonding resistance and high bonding strength while enjoying the superb reliability of solder-to-solder bonding.

What is claimed is:

1. A method of fabricating a solder-bearing silicon semiconductor device comprising:

a step of forming on a silicon semiconductor device substrate at least one first metal layer that makes ohmic contact with semiconductor of the substrate, a step of overlaying a second metal layer to completely cover all surfaces of the first metal layer including side surfaces thereof, the metal of the second metal layer having higher resistance to corrosion by organic acid and better solder wettability than the metal of the first metal layer, a step of covering the whole surface of the second metal layer with an insulating material, a step of etching the insulating material to open a window exposing a prescribed region of the surface of the second metal layer, a step of selectively imparting adhesiveness to the exposed surface of the second metal layer a step of adhering solder powder to the adhesive portion imparted with adhesiveness, and a step of melting the adhered solder powder by heating to form a solder bump on the surface of the second metal layer.

2. A fabricating method according to claim 1, wherein the metal of the first metal layer is one member selected from among Cu, Al, Ti, W and Al-base alloy and the metal of the second metal layer is one member selected from among Cu, Ni and Au but excluding Cu when the first metal layer is of Cu.

3. A fabricating method according to claim 2, wherein the Al-base alloy is one member selected from among Al—Si, Al—Ti and Al—W containing not more than 5% of Si, Ti or W.

4. A fabricating method according to claim 1, wherein the insulating material is one member selected from among $SiO_2$, $Si_3N_4$, glass and polyimide resin.

5. A method of fabricating a circuit board mounted with a semiconductor device comprising:

a step of forming on a silicon semiconductor device substrate at least one first metal layer that makes ohmic contact with semiconductor of the substrate, a step of overlaying a second metal layer to completely cover all surfaces of the first metal layer including side surfaces thereof, the metal of the second metal layer having higher resistance to corrosion by organic acid and better solder wettability than the metal of the first metal layer, a step of covering the whole surface of the second metal layer with an insulating material, a step of etching the insulating material to open a window exposing a prescribed region of the surface of the second metal layer, a step of selectively imparting adhesiveness to the exposed surface of the second metal layer a step of adhering solder powder to the adhesive portion imparted with adhesiveness, a step of melting the adhered solder powder by heating to form a solder bump on the surface of the second metal layer, a step of selectively imparting adhesiveness to at least one electrode portion of a wiring board, a step of adhering solder powder to the adhesive portion of the wiring board imparted with adhesiveness, a step of melting the adhered solder powder by heating to form a solder bump on the electrode portion, and a step of contacting and fusing the solder bump of the semiconductor device and the solder bump of the wiring board so as to form a prescribed gap portion.

6. A fabricating method according to claim 5, wherein the metal of the first metal layer is one member selected from among Cu, Al, Ti, W and Al-base alloy and the metal of the second metal layer is one member selected from among Cu, Ni and Au but excluding Cu when the first metal layer is of Cu.

7. A fabricating method according to claim 6, wherein the Al-base alloy is one member selected from among Al—Si, Al—Ti and Al—W containing not more than 5% of Si, Ti or W.

8. A fabricating method according to claim 5, wherein the insulating material is one member selected from among $SiO_2$, $Si_3N_4$, glass and polyimide resin.

9. A fabricating method according to claim 5, wherein the solder powder imparted to the adhesive portion of the second metal layer and the solder powder imparted to the adhesive portion of the wiring board have different melting points.

10. A fabricating method according to claim 5, further comprising a step of charging insulating resin for sealing into the gap portion between the semiconductor device and the wiring board.

* * * * *